(12) United States Patent
Oh (10) Patent No.: US 8,359,485 B2
(45) Date of Patent: *Jan. 22, 2013

(54) NON-VOLATILE SEMICONDUCTOR MEMORY DEVICE WITH POWER SAVING FEATURE

(75) Inventor: HakJune Oh, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/408,252

(22) Filed: Feb. 29, 2012

(65) Prior Publication Data

US 2012/0159055 A1     Jun. 21, 2012

Related U.S. Application Data

(63) Continuation of application No. 12/210,580, filed on Sep. 15, 2008, now Pat. No. 8,145,925.

(60) Provisional application No. 61/048,737, filed on Apr. 29, 2008, provisional application No. 61/015,724, filed on Dec. 21, 2007.

(51) Int. Cl.
G06F 1/26 (2006.01)
G06F 1/32 (2006.01)

(52) U.S. Cl. ........................... 713/320; 365/233

(58) Field of Classification Search .................. 713/320; 365/233

See application file for complete search history.

(56) References Cited

U.S. PATENT DOCUMENTS

| | | |
|---|---|---|
| 5,167,024 A | 11/1992 | Smith et al. |
| 5,313,429 A | 5/1994 | Chevallier et al. |
| 5,333,300 A | 7/1994 | Fandrich |
| 5,452,259 A | 9/1995 | McLaury |
| 5,473,563 A | 12/1995 | Suh et al. |
| 5,526,311 A | 6/1996 | Kreifels et al. |
| 5,541,879 A | 7/1996 | Suh et al. |
| 5,546,341 A | 8/1996 | Suh et al. |
| 5,708,611 A | 1/1998 | Iwamoto et al. |
| 5,765,002 A | 6/1998 | Garner et al. |
| 5,778,419 A | 7/1998 | Hansen et al. |
| 5,796,673 A | 8/1998 | Foss et al. |
| 5,806,070 A | 9/1998 | Norman et al. |
| 5,903,496 A | 5/1999 | Kendall et al. |

(Continued)

OTHER PUBLICATIONS

"1G Bits DDR3 SDRAM, Preliminary Data Sheet E1128E10 (Ver. 1.0)", http://www.commsdesign.com/show/Article.jhtml?articleID=183700957, 1-130, Aug. 1, 2007.

(Continued)

*Primary Examiner* — Thomas Lee
*Assistant Examiner* — Xuxing Chen (57) ABSTRACT

A non-volatile semiconductor memory device, which comprises (i) an interface having an input for receiving an input clock and a set of data lines for receiving commands issued by a controller including an erase command; (ii) a module having circuit components in a feedback loop configuration and being driven by a reference clock; (iii) a clock control circuit capable of controllably switching between a first state in which the reference clock tracks the input clock and a second state in which the reference clock is decoupled from the input clock; and (iv) a command processing unit configured to recognize the commands and to cause the clock control circuit to switch from the first state to the second state in response to recognizing the erase command. The module consumes less power when the reference clock is decoupled from the input clock than when the reference clock tracks the input clock.

21 Claims, 5 Drawing Sheets

U.S. PATENT DOCUMENTS

| | | | |
|---|---|---|---|
| 5,926,434 | A | 7/1999 | Mori |
| 5,973,552 | A | 10/1999 | Allan |
| 6,026,465 | A | 2/2000 | Mills et al. |
| 6,052,331 | A | 4/2000 | Araki et al. |
| 6,087,868 | A | 7/2000 | Millar |
| 6,091,660 | A | 7/2000 | Sasaki et al. |
| 6,148,363 | A | 11/2000 | Lofgren et al. |
| 6,216,233 | B1 | 4/2001 | Baweja |
| 6,317,812 | B1 | 11/2001 | Lofgren et al. |
| 6,438,060 | B1 | 8/2002 | Li et al. |
| 6,442,644 | B1 | 8/2002 | Gustavson et al. |
| 6,570,791 | B2 | 5/2003 | Roohparvar et al. |
| 6,605,969 | B2 | 8/2003 | Mikhalev et al. |
| 6,696,865 | B2 | 2/2004 | Horiguchi et al. |
| 6,707,747 | B2 | 3/2004 | Zitlaw et al. |
| 6,715,044 | B2 | 3/2004 | Lofgren et al. |
| 6,788,588 | B2 | 9/2004 | Nagai et al. |
| 6,791,889 | B2 | 9/2004 | Peterson |
| 6,809,990 | B2 | 10/2004 | Thomann et al. |
| 6,842,396 | B2 | 1/2005 | Kono |
| 6,850,458 | B2 | 2/2005 | Li |
| 7,031,221 | B2 | 4/2006 | Mooney et al. |
| 7,078,950 | B2 | 7/2006 | Johnson |
| 7,096,283 | B2 | 8/2006 | Roohparvar |
| 7,177,208 | B2 | 2/2007 | Smith et al. |
| 7,227,383 | B2 | 6/2007 | Hoberman et al. |
| 7,292,061 | B2 | 11/2007 | Oh |
| 7,298,670 | B2 | 11/2007 | Werner et al. |
| RE40,147 | E | 3/2008 | Aizawa |
| 8,145,925 | B2 * | 3/2012 | Oh .............................. 713/320 |
| 2001/0010650 | A1 | 8/2001 | Lee |
| 2002/0122347 | A1 | 9/2002 | Frulio et al. |
| 2004/0027866 | A1 | 2/2004 | Pekny |
| 2004/0042319 | A1 | 3/2004 | Lee |
| 2004/0148482 | A1 | 7/2004 | Grundy et al. |
| 2005/0105363 | A1 | 5/2005 | Ko |
| 2005/0146981 | A1 | 7/2005 | Ahn |
| 2005/0232008 | A1 | 10/2005 | Shukuri et al. |
| 2005/0265073 | A1 | 12/2005 | Chae et al. |
| 2006/0044029 | A1 | 3/2006 | Gomm et al. |
| 2006/0119991 | A1 | 6/2006 | Garg et al. |
| 2007/0058480 | A1 | 3/2007 | Hwang |
| 2007/0076502 | A1 | 4/2007 | Pyeon et al. |
| 2007/0096774 | A1 | 5/2007 | Yang et al. |
| 2007/0109833 | A1 | 5/2007 | Pyeon et al. |
| 2007/0153576 | A1 | 7/2007 | Oh et al. |
| 2007/0234100 | A1 | 10/2007 | Baker et al. |
| 2007/0258295 | A1 | 11/2007 | Kagan et al. |
| 2007/0268777 | A1 | 11/2007 | Brox |
| 2007/0279112 | A1 | 12/2007 | Maeda et al. |
| 2008/0088358 | A1 | 4/2008 | Caplan et al. |
| 2008/0089167 | A1 | 4/2008 | Dono |
| 2008/0168296 | A1 | 7/2008 | Oh et al. |
| 2008/0198682 | A1 | 8/2008 | Pyeon |
| 2008/0201588 | A1 | 8/2008 | Pyeon et al. |
| 2008/0219053 | A1 | 9/2008 | Kim |
| 2008/0226004 | A1 | 9/2008 | Oh |
| 2009/0164830 | A1 | 6/2009 | Oh |
| 2009/0259873 | A1 | 10/2009 | Oh |

OTHER PUBLICATIONS

"1GB Q-DIE DDR2 SDRAM Specification", 1-45, Sep. 1, 2007.
Takeuchi, K. et al, A 56NM CMOS 99MM2 8GB Multi-Level NAND Flash Memory With 10MB/S Program Throughput,Solid-State Circuits, 2006 IEEE International Conference Digest of Technical Papers, Seesion 7, ISBN:1-4244-0079-1, 10 pages, Feb. 6, 2006.
"Clocking Lecture 2 and 3, Purpose-Clocking Design Topics", 1-42, Dec. 4, 2002.
"DDR2 Fully Buffered DIMM 240 Pin FIBDIMMS Based on 512 MB C-DIE" (Rohs Compliant) Rev. 1.3, 1-32, Sep. 1, 2006.
"DDR2 SDRAM, Device and Operating and Timing Diagram", 1-46, May 1, 2007.
"Double Data Rate (DDR) SDRAM", 1GB: x4, x8, 16 DDR SDRAM, Rev. A 5/07, 1-82, Jan. 1, 2003.
Kao, James T, "Dual Threshold Voltage Techniques for Low Power Digital Circuits", IEEE Journal Solid-State Circuits, vol. 35, No. 7, 1-10, Jul. 1, 2000.
Shahed, Ameer, "Enabling Platform Non-Volatile Memory Solutions", Intel Developer Forum, 1-38, Feb. 13, 2008.
Cooke, Jim, "Flash Memory 101: An Introduction to NAND Flash", http://www.commsdesign.com/show/Article.
jhtml?articleID=183700957, 1-10, Mar. 31, 2008.
"Hyperlink NAND (HLNAND TM) Flash Specification HL1-200/ HL 1-266; Version 1.61", 1-83, May 25, 2007.
Hypertransport I/O Link Specification, Revision 3.00a, Document #HTC20051222-0046-0017, 1-443, Nov. 22, 2006.
Hypertransport TM I/O Link Specification, Revision 2.00b, Document No. HTC20031217-0036-0010, Hyperstransport Technology Consortium, 1-325, Apr. 27, 2005.
Hypertransport TM IO Link Specification, Revision 3.00, Document No. HTC20051222-0046-0008, Hyperstransport Technology Consortium, 1-428, Apr. 21, 2006.
IEEE Standard for High-Bandwidth Memory Interface Based on Scalable Coherent Interface (SCI) Signaling Technology (RAMLINK), IEEE STD. 1596.4-1996, The Institute of Electrical Electronics Engineers, Inc., 1-98, Mar. 19, 1996.
Ziaie, Kazem, "International Patent Application No. PCT/CA2008/ 001623, Search Report", 65-66, Nov. 20, 2008.
Ziaie, Kazem, "International Patent Application No. PCT/CA2008/ 001623, Written Opinion", 1-3, Nov. 20, 2008.
Maneatis, John G., "Low-Jitter Process-Independant DLL and PLL Based on Self-Biased Techniques" IEEE Journal of Solid-State Circuits vol. 31 No. 11, 1-10, Nov. 1, 1996.
NAND Flash Memory Features, 4GB, 8GB, and 16GB x8 Rev. B , 1-81, Feb. 1, 2007.
Myers, Paul R., Office Action dated Feb. 2, 2012; U.S. Appl. No. 12/488,278.
"ONFI, ONFI Breaks Speed Barrier for Nand Flash", Search Results for Google, 1-3, Nov. 14, 2007.
"ONFI, Open NAND Flash Interface Specification, Revision 1.0", 1-106, Dec. 28, 2006.
"ONFI, Open NAND Flash Interface Specification, Revision 2.0", 1-174, Feb. 27, 2008.
Kao, J, "Part II Leakage Reduction Techniques", ICCAD, 1-50, Jan. 1, 2002.
Kim, Jin-Ki, "Partial Block Erase Architecture for Flash Memory", 1-52, Apr. 16, 2008.
Nakagaome, Y. et al, "Review and Future Prospects of Low-Voltage RAM Circuits", 1-28, Sep. 1, 2003.
Xuxing, Chen, "U.S. Appl. No. 12/210,580, Office Action", 1-21, May 26, 2011.

* cited by examiner

NON-VOLATILE SEMICONDUCTOR MEMORY DEVICE WITH POWER SAVING FEATURE

CROSS-REFERENCE TO RELATED APPLICATION

The present application is a continuation and claims the priority benefit of U.S. patent application Ser. No. 12/210,580, filed on Sept. 15, 2008 now U.S. Pat. No. 8,145,925, which claims the priority benefit of U.S. Provisional Application No. 61/048,737 filed on Apr. 29, 2008 as well as the priority benefit of U.S. Provisional Application No. 61/015,724 filed on Dec. 21, 2007. The disclosures of each of the aforementioned applications are expressly incorporated herein by reference in their entireties.

BACKGROUND

Non-volatile memory is used for various purposes mainly related to persistent data storage with possibility of modification. Practical applications of non-volatile re-writable memory include storage of digital pictures, computer files, digitally recorded music and so on. Thus, it is common to find non-volatile re-writable memory devices in everyday electronics such as computers, digital cameras, MP3 players, answering machines, cell phones, etc.

There are many ways in which data can be physically stored by a non-volatile memory device that also allows re-writing. One example is by using a magnetic disk as can be found in many computer hard drives. Another example is by way of an optical disk such as a CD-R/W.

Yet another example is by means of a solid state memory circuit such as an electrically erasable and programmable read-only memory (EEPROM), a specific example of which is a flash memory device. A flash memory device utilizes a high voltage to erase a large block of non-volatile memory cells in one operation, allowing these cells to then be reprogrammed with new data. By virtue of their robustness, convenience and low cost, flash memory devices have gained immense popularity in the marketplace for non-volatile memory and are expected to become even more dominant as the demand for non-volatile memory continues to grow unabated.

In the years since flash memory was first introduced, technological refinements have been made in order to allow flash memory devices to be operated at increasingly higher speeds. This has further expanded the breadth of consumer applications such as, for example, certain video and photo related applications, in which flash memory devices can be used. However, faster operation of a flash memory device can also lead to specific problems when attempting to create a large high-speed memory store from multiple devices. In particular, the electrical power consumption of flash memory, which increases with operating frequency, can significantly limit the overall capacity of the memory store being created.

Against this background, there is clearly a need for a non-volatile semiconductor memory device with reduced power consumption.

SUMMARY

A first aspect of the present invention seeks to provide a non-volatile semiconductor memory device, which comprises (i) an interface having an input port for receiving an input clock signal and a set of data lines for receiving commands, including an erase command, the commands issued by a controller; (ii) a module having circuit components in a feedback loop configuration, the module being driven by a reference clock signal; (iii) a clock control circuit capable of controllably switching between a first operational state in which the reference clock signal tracks the input clock signal and a second operational state in which the reference clock signal is decoupled from the input clock signal; and (iv) a command processing unit configured to recognize the commands issued by the controller and to cause the clock control circuit to switch from the operational state to the second operational state in response to recognizing the erase command. When the reference clock signal tracks the input clock signal, the module consumes a first amount of power and wherein when the reference clock signal is decoupled from the input clock signal, the module consumes a second amount of power that is less than the first amount of power.

A second aspect of the present invention seeks to provide a non-volatile semiconductor memory device, which comprises first means for providing an input clock signal; second means having circuit components in a feedback loop configuration and being driven by a reference clock signal; third means for controllably switching between a first operational state in which the reference clock signal tracks the input clock signal and a second operational state in which the reference clock signal is decoupled from the input clock signal; and fourth means for recognizing commands issued by a controller, including an erase command, and varying the operational state of the third means in response to recognizing the erase command. When the reference clock signal tracks the input clock signal, the second means consumes a first amount of power and wherein when the reference clock signal is decoupled from the input clock signal, the second means consumes a second amount of power that is less than the first amount of power.

A third aspect of the present invention seeks to provide a method implemented by a non-volatile semiconductor memory device. The method comprises providing an input clock signal; providing a module with circuit components in a feedback loop configuration and being driven by a reference clock signal; producing the reference clock signal such that it follows the input clock signal in a first operational state of the device and such that it is decoupled from the input clock signal in a second operational state of the device, wherein when the reference clock signal follows the input clock signal, the module consumes a first amount of power and wherein when the reference clock signal is decoupled from the input clock signal, the module consumes a second amount of power that is less than the first amount of power; and causing the device to switch from the first operational state to the second operational state in response to recognizing an erase command received from a controller.

A fourth aspect of the present invention seeks to provide a system, which comprises a controller configured to issue a master clock signal and to issue commands including an erase command; and a non-volatile semiconductor memory device. The non-volatile semiconductor memory device comprises (i) an interface with an input port for receiving an input clock signal related to the master clock signal and a set of data lines for receiving the commands issued by the controller; (ii) a module having circuit components in a feedback loop configuration, the module being driven by a reference clock signal; (iii) a clock control circuit capable of controllably switching between a first operational state in which the reference clock signal tracks the input clock signal and a second operational state in which the reference clock signal is decoupled from the input clock signal; and (iv) a command processing unit configured to recognize the commands issued by the controller and to cause the clock control circuit to switch from the first operational state to the second operational state in response to recognizing the erase command. When the reference clock signal tracks the input clock signal, the module consumes a first amount of power and wherein when the reference clock signal is decoupled from the input clock signal, the module consumes a second amount of power that is less than the first amount of power.

A fifth aspect of the present invention seeks to provide a computer-readable storage medium comprising computer-readable instructions which, when processed, are used to provide a non-volatile semiconductor memory device with functionality for: producing a reference clock signal such that it follows an input clock signal in a first operational state of the device and such that it is decoupled from the input clock signal in a second operational state of the device, wherein when the reference clock signal follows the input clock signal, a first amount of power is consumed by a module with circuit components in a feedback loop configuration that is driven by the reference clock signal, and wherein when the reference clock signal is decoupled from the input clock signal, the module consumes a second amount of power that is less than the first amount of power; and causing the device to switch from the first operational state to the second operational state in response to recognizing an erase command received from a controller.

Thus, an improved non-volatile semiconductor memory device has been provided.

DETAILED DESCRIPTION

Figure 1:
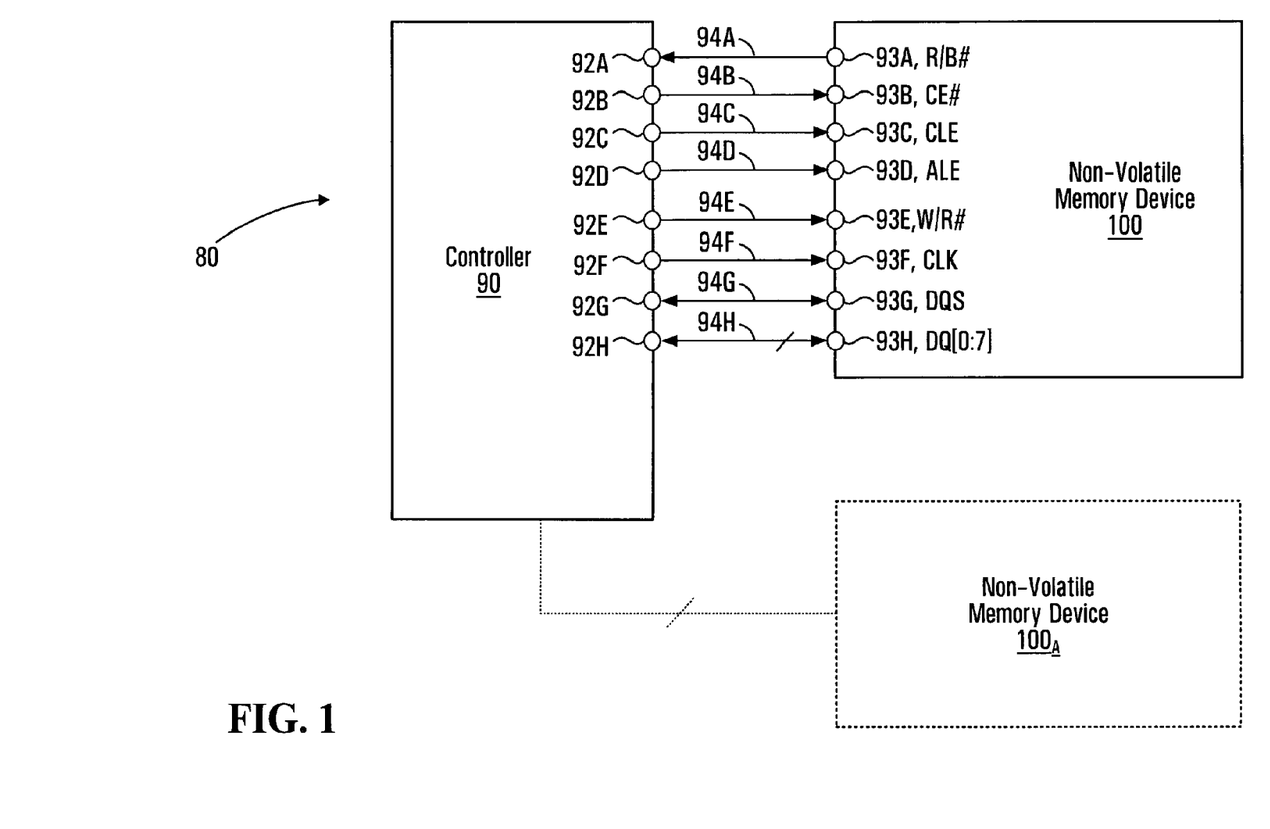
FIG. 1 is a block diagram of a memory system comprising a controller and a non-volatile memory device, in accordance with a non-limiting example embodiment.

Reference is made to FIG. 1, which illustrates a memory system 80 in accordance with an example embodiment. The memory system 80 comprises a controller 90 communicatively coupled to a non-volatile memory device 100. The controller 90 may also be communicatively coupled to other memory devices $100_A$.

The controller 90 comprises a set of ports 92A ... 92H, which are respectively connected to a set of ports 93A ... 93H of the non-volatile memory device 100. The controller 90 and the non-volatile memory device 100 exchange device-external electrical signals 94A ... 94H via their respective sets of ports, 92A ... 92H and 93A ... 93H. The ports 93A ... 93H of the non-volatile memory device 100 and the device-external signals 94A ... 94H will be described in greater detail subsequently herein.

Figure 2:
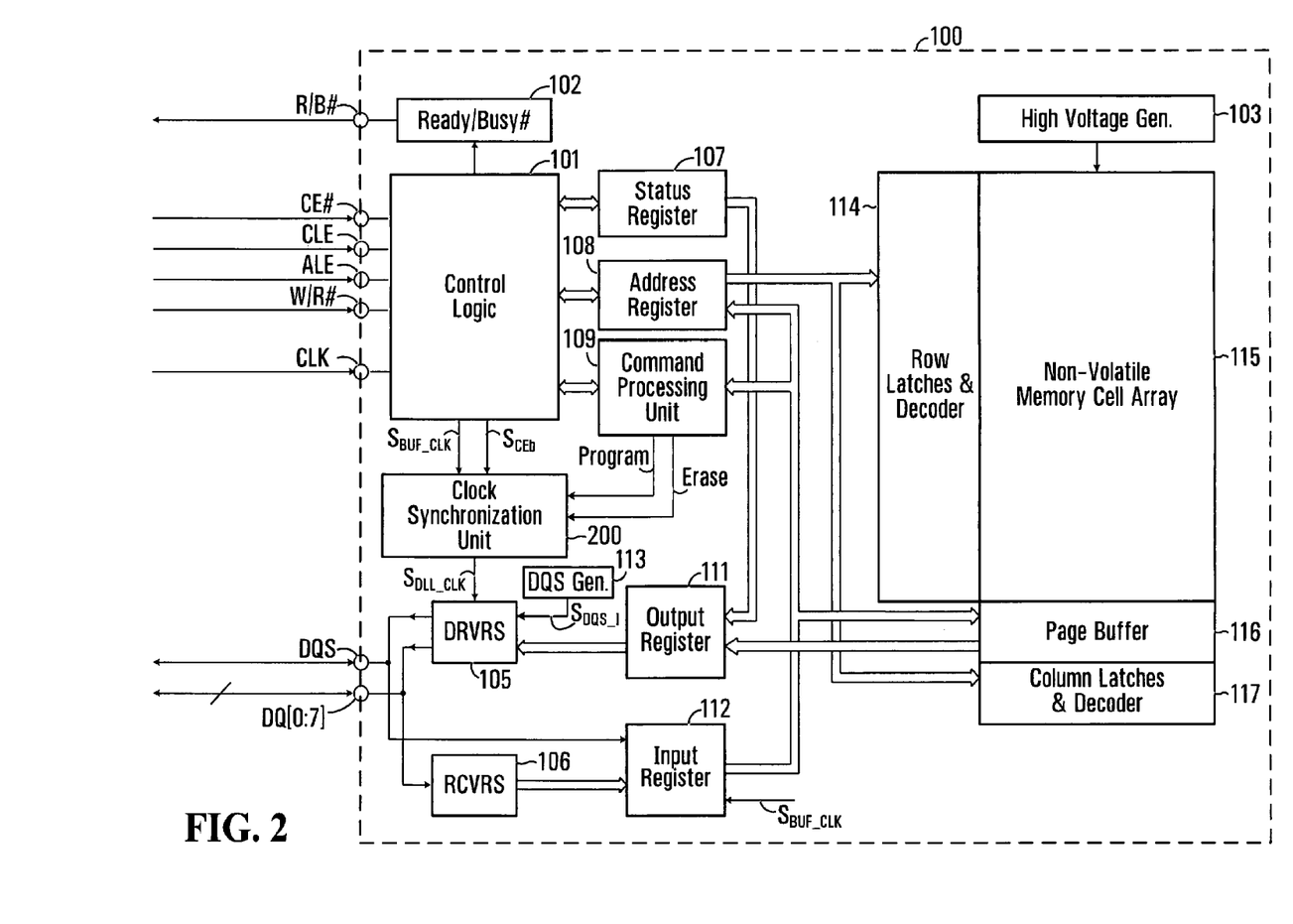
FIG. 2 is a block diagram of the non-volatile memory device in FIG. 1 which includes a clock synchronization unit, in accordance with a non-limiting example embodiment.

FIG. 2 is a block diagram of the non-volatile memory device 100 in accordance with an example embodiment. Within the non-volatile memory device 100, a non-volatile memory cell array 115 includes a plurality of non-volatile memory cells arranged in rows and columns. Each non-volatile memory cell includes a floating-gate field-effect transistor capable of holding a charge for the non-volatile storage of data. The non-volatile memory cells in the non-volatile memory cell array 115 can be electrically programmed by charging the floating gate.

The rows of the non-volatile memory cell array 115 can be arranged in blocks of pages. By way of non-limiting example, the rows of the non-volatile memory cell array 115 can be organized into 2048 blocks, with 64 pages per block.

The non-volatile memory device 100 comprises an interface that includes the aforementioned set of ports 93A ... 93H. Among these, ports 93B, 93C, 93D, 93E, 93F (also labeled CE#, CLE, ALE, W/R#, CLK, respectively) carry device-external signals from the controller 90 to the non-volatile memory device 100. Ports 93A (also labeled R/B#) carries device-external signals from the non-volatile memory device 100 to the controller 90. Finally, ports 93G and 93H (also labeled DQS and DQ[0:7], respectively) are capable of carrying device-external signals in either direction depending on an operating mode of the non-volatile memory device 100. More specifically, the ports of the non-volatile memory device 100 include, without limitation:

a chip enable port (93B, also labeled CE#):
The chip enable port CE# is an input port that allows the non-volatile memory device 100 to know whether or not it has been activated by the controller 90. In the present non-limiting embodiment, when the device-external signal at the chip enable port CE# is de-asserted (LOW), this means that the non-volatile memory device 100 has been selected, whereas when the device-external signal at the chip enable port CE# is asserted (HIGH), this means that the non-volatile memory device 100 has been de-selected.

an input clock port (93F, also labeled CLK):
The input clock port CLK is an input port that carries a clock signal (a system clock) used to synchronize operation of the non-volatile memory device 100. Thus, it should be understood that by virtue of being synchronized to the system clock, the non-volatile memory device 100 differs from asynchronous or plesiochronous memory devices.

a plurality of data lines (93H, also labeled DQ[0:7]):
The data lines DQ[0:7] carry addresses, commands and write data from the controller 90, as well as carry read data to the controller 90. While in the illustrated embodiment there are eight (8) data lines, this should not be considered a limitation. For example, in other embodiments, a different number of data lines may be provided, such as sixteen (16). Still other possibilities exist.

a command latch enable port (93C, also labeled CLE) and an address latch enable port (93D, also labeled ALE):
The command latch enable port CLE and the address latch enable port ALE are input ports that carry device-external signals which parallel the device-external signals on the data lines DQ[0:7] and delineate the start and end of addresses, commands and/or write data.

a data strobe port (93G, also labeled DQS):
The data strobe port DQS carries a device-external signal that indicates the presence of valid data on the data lines DQ[0:7]. When data is to be written to the non-volatile memory device 100 (in a non-limiting double data rate embodiment), the device-external signal at the data strobe port DQS is generated by the controller 90, has the same frequency as the device-external signal at the input clock port CLK, and is 90°-shifted and center aligned with the device-external signal on the data lines DQ[0:7]. When data is being read from the non-volatile memory device 100 (in a non-limiting double data rate embodiment), the device-external signal at the data strobe port DQS is generated by the non-volatile memory device 100, has the same frequency as the device-external signal at the input clock port CLK, and is edge-aligned with the device-external signal on the data lines DQ[0:7]. It should be appreciated that in the absence of valid data on the data lines DQ[0:7], the device-external signal at the data strobe port DQS can be made to not oscillate. As such, there will be periods when the device-external signal at the data strobe port DQS oscillates and periods when it does not.

a write/read port (93E, also labeled W/R#):

The write/read port W/R# is an input port that carries a device-external signal indicating whether the data lines DQ[0:7] carry write data from the controller 90 (i.e., when the device-external signal W/R# is HIGH) or carry read data from the memory device 100 (i.e., when the device-external signal W/R# is LOW).

a ready/busy port (93A, also labeled R/B#):

The ready/busy port R/B# is an output port that carries a device-external signal indicating whether the non-volatile memory device 100 is available to receive a command for accessing the memory cell array 115 (when the device-external signal is HIGH) or is busy processing a command for accessing the memory cell array 115 (when the device-external signal is LOW).

The controller 90 controls behavior of the non-volatile memory device 100 by varying the device-external signals at the various input ports and on the data lines. Accordingly, the non-volatile memory device 100 comprises control logic 101 that is configured to recognize when the input ports and data lines carry certain specific signals from the controller 90, and to respond in a deterministic way based upon these signals.

For example, the control logic 101 is configured to recognize when the device-external signal at the command latch enable port CLE is HIGH and the device-external signal at the address latch enable port ALE is LOW. In this case, the control logic 101 considers that the information on the data lines DQ[0:7] is command information. Accordingly, the information on the data lines DQ[0:7] is received by an input receiver 106, latched into an input register 112 on the rising edge of a buffered clock signal $S_{BUF\_CLK}$ (which is a buffered version of the device-external signal at the input clock port CLK and has the same polarity) and provided to a command processing unit 109. The command processing unit 109 may include a register into which the information is loaded and a decoder for decoding the loaded information into one or more commands. The command processing unit 109 generates control signals, some of which are fed to the control logic 101 and others of which are fed to the clock synchronization unit 200, as will be described in further detail later on.

In some embodiments, the command processing unit 109 is integrated with the control logic 101, while in other embodiments, the command processing 109 and the control logic 101 may be distinct components of the memory device 100. In still other embodiments, portion of the command processing unit 109 (such as a register) can be distinct while the remainder of the command processing unit 109 may be integrated with the control logic 101.

There are several examples of commands that can be processed by the non-volatile memory device 100, including BLOCK ERASE, PAGE PROGRAM, PAGE READ, STATUS READ, to name a few non-limiting possibilities. Some of these commands and their effects are described below by way of non-limiting example.

A) Block Erase

When the control logic 101 recognizes a BLOCK ERASE command (more precisely: an indicative first command cycle of the BLOCK ERASE command), the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, the information on the data lines DQ[0:7] is received by the input receiver 106, latched into the input register 112 on the rising edge of the aforementioned buffered clock signal $S_{BUF\_CLK}$ and transferred into an address register 108. The address information, which can span over multiple address cycles, may include a plurality of bytes specifying the address of a desired block to be erased. The address information in its entirety can be loaded into a row latches and decoder 114.

The control logic 101 is configured to subsequently expect to receive a second command cycle of the BLOCK ERASE command on the data lines DQ[0:7]. Accordingly, when the device-external signal at the command latch enable port CLE is HIGH and the device-external signal at the address latch enable port ALE is LOW, the information on the data lines DQ[0:7] is received by the input receiver 106, latched into the input register 112 on the rising edge of the buffered clock signal $S_{BUF\_CLK}$ and transferred to the command processing unit 109. The command processing unit 109 recognizes the second command cycle of the BLOCK ERASE command.

The command processing unit 109 then asserts an ERASE signal that is used by the clock synchronization unit 200 as will be described herein below. The control logic 101 causes the device-external signal at the ready/busy port R/B# to go LOW in order to indicate that the non-volatile memory device 100 is busy. Also, The control logic 101 then invokes a high voltage generator 103 to apply high voltages in order to erase the non-volatile memory cells that are within the desired block. This operation may take an extended period of time that, for current technology, is within the range of about 2 milliseconds to about 15 milliseconds, depending on a variety of factors.

After the non-volatile memory cells within desired block have been erased, the command processing unit 109 de-asserts the ERASE signal. Then, after a time interval needed by certain components of the clock synchronization unit 200 to re-acquire synchronization, the control logic 101 causes the device-external signal at the ready/busy port R/B# to go HIGH in order to indicate that the non-volatile memory device 100 is ready to receive another command.

B) Page Program

When the control logic 101 recognizes a PAGE PROGRAM command (more precisely: an indicative first command cycle of the PAGE PROGRAM command), the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, the information on the data lines DQ[0:7] is received by the input receiver 106, latched into the input register 112 on the rising edge of the buffered clock signal $S_{BUF\_CLK}$ and transferred into the address register 108. The address information, which can span over multiple address cycles, may include a plurality of bytes specifying a desired page to be programmed.

The address information can be loaded into the row latches and decoder 114 and/or a column latches and decoder 117.

The control logic 101 then expects to receive write data on the data lines DQ[0:7]. This occurs when the device-external signals at both the command latch enable port CLE and the address latch enable port ALE, as well as the device-external signal at the write/read port W/R#, are all HIGH. Additional use is made of the device-external signal at the data strobe port DQS. In this case, the write data being received by the input receiver 106 is latched into the input register 112 at both edges of the device-external signal at the data strobe port DQS and is selected by the column latches and decoder 117 to be loaded into a page buffer 116.

When the device-external signals at the command latch enable port CLE and the address latch enable port ALE are no longer both HIGH, the non-volatile memory device 100 stops latching the write data, and thus the amount of write data written to the non-volatile memory device 100 is determined by the length of time during which the device-external signals at both the command latch enable port CLE and the address latch enable port ALE had remained HIGH. For example, if the device-external signals at both the command latch enable port CLE and the address latch enable port ALE had remained HIGH for 1024 clock cycles, the non-volatile memory device 100 would have received 2048 bytes of write data (for an 8-bit-wide data bus in a double data rate scenario).

The control logic 101 is configured to subsequently expect to receive a second command cycle of the PAGE PROGRAM command on the data lines DQ[0:7]. Accordingly, when the device-external signal at the command latch enable port CLE is HIGH and the device-external signal at the address latch enable port ALE is LOW, the information on the data lines DQ[0:7] is received by the input receiver 106, latched into the input register 112 on the rising edge of the buffered clock signal $S_{BUF\_CLK}$ and transferred into the command processing unit 109. The command processing unit 109 recognizes the second command cycle of the PAGE PROGRAM command.

The command processing unit 109 then asserts a PROGRAM signal that is used by the clock synchronization unit 200 as will be described herein below. In addition, the control logic 101 causes the device-external signal at the ready/busy port R/B# to go LOW in order to indicate that the non-volatile memory device 100 is busy. The control logic 101 then invokes the high voltage generator 103 to apply high voltages in order to transfer the write data in the page buffer 116 to the desired page in the non-volatile memory cell array 115. This operation may take an extended period of time that, for current technology, is within the range of about 200 microseconds to about 2 milliseconds, depending on a variety of factors.

After the non-volatile memory cells within the desired page have been programmed, the command processing unit 109 de-asserts the PROGRAM signal. Then, after a time interval needed by certain components of the clock synchronization unit 200 to re-acquire synchronization, the control logic 101 causes the device-external signal at the ready/busy port R/B# to go HIGH in order to indicate that the non-volatile memory device 100 is ready to receive another command.

C) Page Read

When the control logic 101 recognizes a PAGE READ command (more precisely: an indicative first command cycle of the PAGE READ command), the control logic 101 is configured to subsequently expect to receive address information on the data lines DQ[0:7]. Address information is deemed to be present on the data lines DQ[0:7] when the device-external signal at the command latch enable port CLE is LOW and the device-external signal at the address latch enable port ALE is HIGH. Accordingly, the information on the data lines DQ[0:7] is received by the input receiver 106, latched into the input register 112 on the rising edge of the buffered clock signal $S_{BUF\_CLK}$ and transferred into the address register 108. The address information, which can span over multiple address cycles, may include a plurality of bytes specifying a desired page to be read. The address information can be loaded into the row latches and decoder 114 and/or the column latches and decoder 117.

The control logic 101 is configured to subsequently expect to receive a second command cycle of the PAGE READ command on the data lines DQ[0:7]. Accordingly, when the device-external signal at the command latch enable port CLE is HIGH and the device-external signal at the address latch enable port ALE is LOW, the information on the data lines DQ[0:7] is received by the input receiver 106, latched into the input register 112 on the rising edge of the buffered clock signal $S_{BUF\_CLK}$ and transferred into the command processing unit 109. The command processing unit 109 recognizes the second command cycle of the PAGE READ command.

In addition, the control logic 101 causes the device-external signal at the ready/busy port R/B# to go LOW in order to indicate that the non-volatile memory device 100 is busy. The control logic 101 then invokes the high voltage generator 103 to apply high voltages in order to transfer the cell data in the desired page in the non-volatile memory cell array 115 to the page buffer 116. This operation may take an extended period of time that, for current technology, is within the range of about 20 microseconds to about 60 microseconds, depending on a variety of factors.

After the contents of the desired page have been transferred to the page buffer 116, the control logic 101 causes the device-external signal at the ready/busy port R/B# to go HIGH in order to indicate that the non-volatile memory device 100 is ready to output the read data in the page buffer 116 or to receive another command.

The control logic 101 then expects to output read data onto the data lines DQ[0:7]. For this to happen, the device-external signals on both the command latch enable port CLE and the address latch enable port ALE have to be HIGH and the device-external signal at the write/read port W/R# has to be LOW. Then, the data in the page buffer 116 is output to the data lines DQ[0:7] through an output register 111 and an output driver 105. This is carried out in a synchronous manner. Specifically, the data from the page buffer 116 is selected by the column latches and decoder 117 to be loaded to the output register 111. The output driver 105 thus sequentially receives the read data from the output register 111. The output driver 105 outputs the read data received from the output register 111 onto the data lines DQ[0:7] and references the read data to rising and falling edges of a synchronizing clock signal $S_{DLL\_CLK}$ received from the clock synchronization unit 200 to be described later on in greater detail.

Meanwhile, the output driver 105 receives an internally generated data strobe signal $S_{DQS\_I}$ that is produced by a data strobe signal generator 113. The internally generated data strobe signal $S_{DQS\_I}$ is HIGH when there is read data to be placed on the data lines DQ[0:7] and is LOW otherwise. The output driver 105 transfers the internally generated data strobe signal $S_{DQS\_I}$ onto the data strobe port DQS but synchronizes it with the rising and falling edges of the aforementioned synchronizing clock signal $S_{DLL\_CLK}$. The device-external signal at the data strobe port DQS is used by the controller 90 for latching data on the data lines DQ[0:7] during read operations.

When the device-external signals at the command latch enable port CLE and the address latch enable port ALE are no longer both HIGH, the non-volatile memory device 100 stops outputting the read data, and thus the amount of read data read from the non-volatile memory device 100 is determined by the length of time during which the device-external signals on both the command latch enable port CLE and the address latch enable port ALE had remained HIGH. For example, if the device-external signals at the command latch enable port CLE and the address latch enable port ALE had remained HIGH for 1024 clock cycles, the non-volatile memory device 100 would have output 2048 bytes of read data (for an 8-bit-wide data bus in a double data rate scenario).

D) Status Read

When the control logic 101 recognizes a STATUS READ command, the control logic 101 is configured to expect that it will subsequently need to output status information on the data lines DQ[0:7]. For this to take place, the device-external signals at both the command latch enable port CLE and the address latch enable port ALE have to be HIGH and the device-external signal at the write/read port W/R# has to be LOW. In this case, the contents of a status register 107 is output to the data lines DQ[0:7] through the output register 111 and the output driver 105. This status read operation is also done in synchronous manner with DQS signal.

Thus, it will be apparent that the ERASE or PROGRAM signal is asserted and de-asserted by the command processing unit 109 based on commands that are received from the controller 90. Specifically, the command processing unit 109 asserts the ERASE signal in response to receipt of the BLOCK ERASE command. The command processing unit 109 asserts the PROGRAM signal in response to receipt of the PAGE PROGRAM command.

It should be appreciated that the non-volatile memory device 100 may comprise other ports and be configured to generate or receive other device-external signals. For example, there could be provided a write protect port that provides hardware protection against unwanted programming or erasure operations. Thus, when the device-external signal at the write protect port is detected as being LOW, the non-volatile memory device 100 can be configured to not accept the aforementioned PAGE PROGRAM or BLOCK ERASE commands.

Also, the non-volatile memory device 100 comprises ready/busy indicator logic 102, which is coupled to the control logic 101 and indicates whether the non-volatile memory device 100 is busy.

One non-limiting example embodiment of the clock synchronization unit 200 is now described with reference to FIG. 3A. The clock synchronization unit 200 comprises a clock control circuit 210 that derives a reference clock signal $S_{REF\_CLK}$ from the aforementioned buffered clock signal $S_{BUF\_CLK}$ and the aforementioned ERASE or PROGRAM signal. The clock control circuit 210 feeds the reference clock signal $S_{REF\_CLK}$ to a delay locked loop (DLL) 220, which produces the synchronizing clock signal $S_{DLL\_CLK}$.

To generate the reference clock signal $S_{REF\_CLK}$ the clock control circuit 210 controllably switches between a first operational state in which the reference clock signal $S_{REF\_CLK}$ tracks the buffered clock signal $S_{BUF\_CLK}$ and a second operational state in which the reference clock signal $S_{REF\_CLK}$ is decoupled from the buffered clock signal $S_{BUF\_CLK}$. The ERASE or PROGRAM signal plays a role in whether the reference clock signal $S_{REF\_CLK}$ tracks the buffered clock signal $S_{BUF\_CLK}$ or is decoupled therefrom. Specifically, and in accordance with a non-limiting example embodiment, the clock control circuit 210 is designed to enter into/remain in the first operational state (i.e., in which the reference clock signal $S_{REF\_CLK}$ tracks the buffered clock signal $S_{BUF\_CLK}$) when neither the ERASE signal nor the PROGRAM signal is asserted by the command processing unit 109. Conversely, the clock control circuit 210 is designed to enter into/remain in the second operational state (i.e., in which the reference clock signal $S_{REF\_CLK}$ is decoupled from the buffered clock signal $S_{BUF\_CLK}$) when at least one of the ERASE and PROGRAM signals is asserted by the command processing unit 109.

Accordingly, in a specific non-limiting embodiment, the clock control circuit 210 can be designed to include an AND logic gate 211 and a NOR logic gate 213. The NOR logic gate 213 is fed by the ERASE and PROGRAM signals from the command processing unit 109. A first input of the AND logic gate 211 is the buffered clock signal $S_{BUF\_CLK}$. A second input of the AND logic gate 211 is a signal $S_{DLL\_EN2}$ that is an output of the NOR logic gate 213. Thus, when the ERASE or PROGRAM signal is asserted, the NOR logic gate 213 causes the signal $S_{DLL\_EN2}$ to go LOW, which disables the AND logic gate 211 and causes its output signal (i.e., the reference clock signal $S_{REF\_CLK}$) to go LOW. This decouples the reference clock signal $S_{REF\_CLK}$ from the buffered clock signal $S_{BUF\_CLK}$. On the other hand, when the ERASE and PROGRAM signals are de-asserted, the NOR logic gate 213 causes the signal $S_{DLL\_EN2}$ to go HIGH, which enables the AND logic gate 211 and causes the reference clock signal $S_{REF\_CLK}$ to track the buffered clock signal $S_{BUF\_CLK}$ while it is provided to the DLL 220.

In one alternative embodiment, the AND logic gate 211 can be a 3-input AND logic gate, with the third input being a signal $S_{DLL\_EN1}$, which is at the output of an inverter logic gate 212 fed by a buffered chip enable signal $S_{cEb}$. The buffered chip enable signal $S_{cEb}$ is a buffered version of the device-external signal at the chip enable port CE# and has the same polarity. This modification of the clock control circuit 210 would cause the AND logic gate 211 to operate as described earlier whenever the buffered chip enable signal $S_{cEb}$ goes LOW (i.e., whenever the non-volatile memory device 100 is selected), but would result in the output of the AND logic gate 211 going LOW whenever the buffered chip enable signal $S_{cEb}$ goes HIGH (i.e., whenever the non-volatile memory device 100 is de-selected), irrespective of whether the ERASE or PROGRAM signal is asserted or not.

In another alternative embodiment, the functionality of the NOR logic gate 213 is implemented elsewhere than in the clock control circuit 210. For example, the functionality of the NOR logic gate 213 could be implemented in the command processing unit 109. As such, the command processing unit 109 may itself issue the signal $S_{DLL\_EN2}$ that is currently illustrated as being at the output of the NOR logic gate 213.

The DLL 220 includes circuit components in a feedback loop configuration to produce the synchronizing clock signal $S_{DLL\_CLK}$ with a controllable delay relative to the reference clock signal $S_{REF\_CLK}$. The controllable delay can be adjusted as needed to ensure that the output driver 105, which receives the synchronizing clock signal $S_{DLL\_CLK}$, outputs the device-external signals on the data lines DQ[0:7] and at the data strobe port DQS to meet desired timing specifications for the non-volatile memory device 100. To achieve the requisite delay, the DLL 220 can be implemented as a conventional DLL that includes a variable delay line 221. The variable delay line 221 varies a delay of the synchronizing clock signal $S_{DLL\_CLK}$ relative to the reference clock signal $S_{REF\_CLK}$ in response to a delay adjustment signal $S_{SHIFT}$.

A feedback delay model 224 generates a feedback clock signal $S_{FB\_CLK}$ in response to the synchronizing clock signal $S_{DLL\_CLK}$. The feedback delay model 224 may have a replica delay model which compensates for internal delays caused by some internal circuit blocks such as:

the AND logic gate 211 in the clock control circuit 210;
an input buffer (not shown) that outputs the buffered clock signal $S_{BUF\_CLK}$ from the device-external signal at the input clock port CLK; and/or
output buffers for the device-external signals on the data lines DQ[0:7] and at the data strobe port DQS.

The DLL 220 further includes a phase detector 222 that receives the feedback clock signal $S_{FB\_CLK}$ and the reference clock signal $S_{REF\_CLK}$, and generates a phase error signal $S_{PE}$ having a value indicating the phase difference between the reference clock signal $S_{REF\_CLK}$ the and feedback clock signal $S_{FB\_CLK}$. A delay control 223 generates the delay adjustment signal $S_{SHIFT}$ in response to the phase error signal $S_{PE}$ from the phase detector 222, and applies the delay adjustment signal $S_{SHIFT}$ to the variable delay line 221 to adjust the delay applied by the variable delay line 221.

The phase detector 222 and the delay control 223 operate in combination to adjust the delay applied by the variable delay line 221 as a function of the detected phase difference between the reference clock signal $S_{REF\_CLK}$ and the feedback clock signal $S_{FB\_CLK}$. Specifically, the phase detector 222 and the delay control 223 operate in combination to adjust the variable delay of the synchronizing clock signal $S_{DLL\_CLK}$ until the phase difference between the reference clock signal $S_{REF\_CLK}$ and feedback clock signal $S_{FB\_CLK}$ is approximately zero. More specifically, as the delay of the synchronizing clock signal $S_{DLL\_CLK}$ is adjusted, the phase of the feedback clock signal $S_{FB\_CLK}$ from the feedback delay model 224 is adjusted accordingly until the feedback clock signal $S_{FB\_CLK}$ has approximately the same phase as the reference clock signal $S_{REF\_CLK}$. When the DLL 220 has adjusted the variable delay to a value causing the phase shift between the reference clock signal $S_{REF\_CLK}$ and the feedback clock signal $S_{FB\_CLK}$ to equal approximately zero, the DLL 220 is said to be "locked". At this point, the device-external signal at the input clock port CLK and the synchronizing clock signal $S_{DLL\_CLK}$ will be synchronized provided that the feedback delay model 224 accurately models the various internal delays.

Considering that the variable delay line 221 in the DLL 220 may contain a large number of delay stages, all of which are switched as an oscillating clock signal propagates through the variable delay line 221, it is clear that a power savings will arise during times when the DLL 220 is not fed with an oscillating clock signal. This, in turn, occurs when the reference clock signal $S_{REF\_CLK}$ is decoupled from the buffered clock signal $S_{BUF\_CLK}$, which is a direct consequence of asserting the ERASE or PROGRAM signal as described earlier. Overall, it will therefore be observed that the average number of signal transitions per second that are effected by the DLL 220 will be less when the reference clock signal $S_{REF\_CLK}$ is decoupled from the buffered clock signal $S_{BUF\_CLK}$ than when the reference clock signal $S_{REF\_CLK}$ tracks the buffered clock signal $S_{BUF\_CLK}$. This results in a power savings that is particularly significant at higher clock signal frequencies.

Figure 3A:
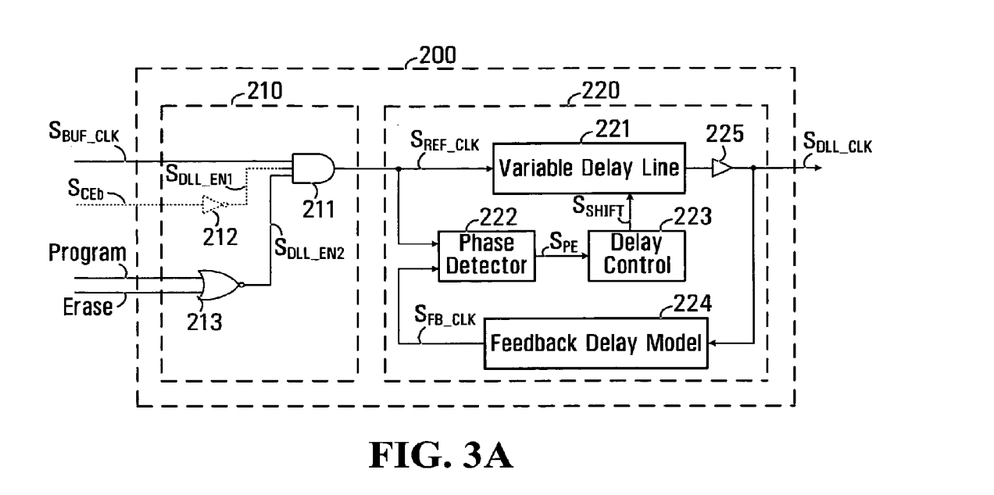
FIG. 3A is a block diagram of the clock synchronization unit in FIG. 2, in accordance with a non-limiting example embodiment.
Figure 3B:
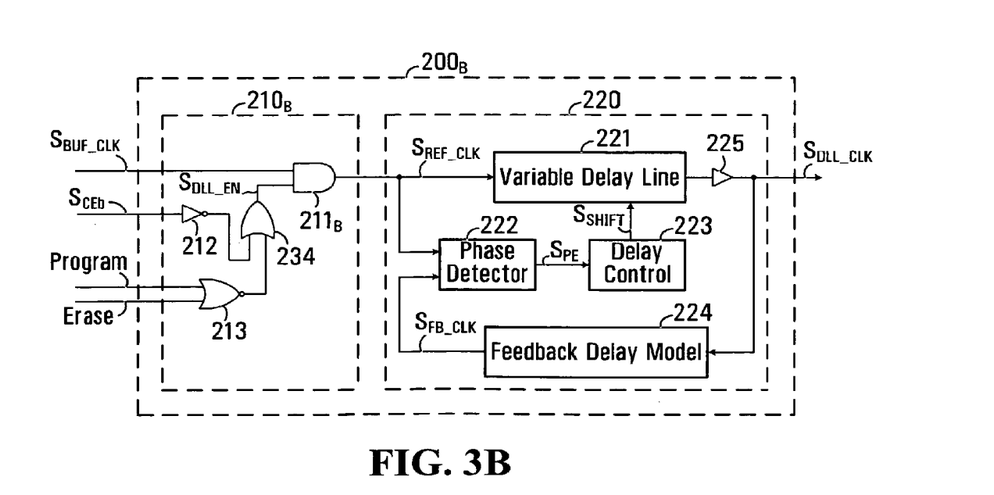
FIG. 3B is a block diagram of the clock synchronization unit in FIG. 2, in accordance with an alternative example embodiment.

Reference is now made to FIG. 3B, which illustrates a clock synchronization unit $200_B$ in accordance with another non-limiting example embodiment. The clock synchronization unit $200_B$ in FIG. 3B comprises a modified clock control circuit $210_B$ that is similar to the clock control circuit 210 in the clock synchronization unit 200 of FIG. 3A, with the following main difference. Specifically, the second input of an AND logic gate $211_B$ is a signal $S_{DLL\_EN}$ which is output by a 2-input OR logic gate 234. The 2-input OR logic gate 234 is fed by the output of the NOR logic gate 213 (which, it is recalled, is fed by the ERASE and PROGRAM signals) and the output of the inverter logic gate 212 (which, it is recalled, is fed by the buffered chip enable signal $S_{cEb}$).

In operation, the modified clock control circuit $210_B$ causes the AND logic gate $211_B$ to transfer the buffered clock signal $S_{BUF\_CLK}$ over to its output (which carries the reference clock signal $S_{REF\_CLK}$) whenever either one of the following conditions is met: (i) the buffered chip enable signal $S_{cEb}$ goes LOW (i.e., whenever the non-volatile memory device 100 is selected) or (ii) the ERASE and PROGRAM signals are de-asserted (=LOW). Conversely, the reference clock signal $S_{REF\_CLK}$ will be decoupled from the buffered clock signal $S_{BUF\_CLK}$ only when both (i) the buffered chip enable signal $S_{cEb}$ goes HIGH (i.e., whenever the non-volatile memory device 100 is de-selected) and (ii) the ERASE or PROGRAM signal is asserted (=HIGH). Simply stated, when compared to the clock control circuit 210 in FIG. 3A, the modified clock control circuit $210_B$ in FIG. 3B does not automatically decouple the reference clock signal $S_{REF\_CLK}$ from the buffered clock signal $S_{BUF\_CLK}$ when the ERASE or PROGRAM signal is asserted, but requires the additional condition whereby the non-volatile memory device 100 has been de-selected. Stated differently, selecting the non-volatile memory device 100 will activate the DLL 220, thus overriding the effect of the ERASE or PROGRAM signal. While this may lead to less of a power savings than in the circuit of FIG. 3A, it nevertheless allows greater control of the operation of the non-volatile memory device 100 directly from the controller 90.

Figure 4A:
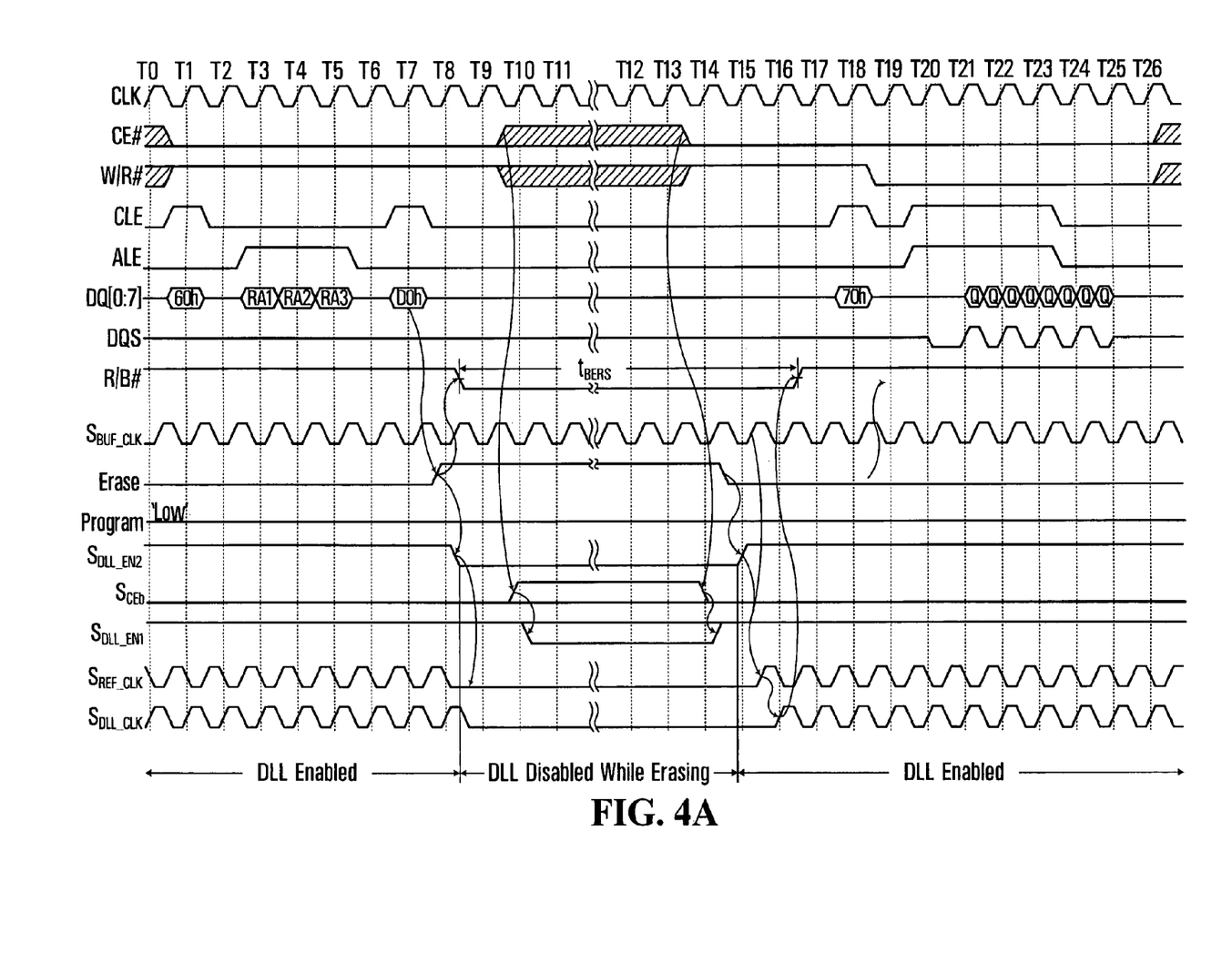
FIG. 4A is a timing diagram that shows signal transitions of various signals associated with the clock synchronization unit of FIG. 3A.

FIG. 4A is a non-limiting example timing diagram that shows signal transitions of various signals associated with the clock synchronization unit 200 in FIG. 3A during a BLOCK ERASE operation. Those skilled in the art will appreciate that similar timing diagrams could be provided for other commands (e.g., PAGE PROGRAM), but have been omitted since it is believed that they are not required in order for the reader to acquire an understanding of example embodiments.

The control signals in the top portion of FIG. 4A (namely those at the input clock port CLK, the chip enable port CE#, the write/read port W/R#, the command latch enable port CLE, the address latch enable port ALE, the data lines DQ[0:7], the data strobe port DQS and the ready/busy port R/B#) are issued by the controller 90. Between times T1 through T7, the non-volatile memory device 100 receives a first cycle of the BLOCK ERASE command (60$h$), row address information (RA1, RA2 & RA3) and a second cycle of the BLOCK ERASE command (D0$h$). Once the non-volatile memory device 100 receives and decodes the second cycle of the BLOCK ERASE command (D0$h$), the ERASE signal is asserted at time T8 and the $S_{DLL\_EN2}$ signal (at the output of the NOR logic gate 213) goes LOW. The AND logic gate 211 is then disabled by the LOW state of the $S_{DLL\_EN2}$ signal. Therefore, the reference clock signal $S_{REF\_CLK}$ goes to the LOW state at around time T8. As a result, the synchronizing clock signal $S_{DLL\_CLK}$ stops toggling even though the buffered cock signal $S_{BUF\_CLK}$ keeps toggling. In addition, the device-external signal at the ready/busy port R/B# signal goes LOW.

The non-volatile memory device 100 then performs an internal "erase and verify" operation on the non-volatile memory cell array 115 for a time specified as $t_{BERS}$ (Block Erase Time), which varies and can be, for example, 2 ms for a SLC (Single Level Cell) type NAND flash memory device or, for example, 15 ms maximum for some types of MLC (Multi-Level-Cell) NAND flash memory devices. During the time that the non-volatile memory device 100 is completing the internal "erase and verify" operation, the DLL 220 is effectively disabled, thus leading to less power consumption than if it were enabled during this time.

Somewhere between times T14 and T15, the non-volatile memory device 100 finishes its final "erase and verify" operation and the ERASE signal goes to the LOW state. As a result, the $S_{DLL\_EN2}$ signal goes back to the HIGH state at time T15, which enables the AND logic gate 211. Therefore, the reference clock signal $S_{REF\_CLK}$ starts to track the buffered clock signal $S_{BUF\_CLK}$ again, and the DLL 220 tries to lock the synchronizing clock signal $S_{DLL\_CLK}$ according to the reference clock signal $S_{REF\_CLK}$ and the feedback clock signal $S_{FB\_CLK}$. Those skilled in the art will appreciate that when the DLL 220 comprises a delay locked loop, a certain number of clock cycles may be needed for the synchronizing clock signal $S_{DLL\_CLK}$ to re-acquire synchronization (i.e., to "relock"). The timing diagram in FIG. 4A assumes a simplified and short re-locking sequence such that the synchronizing clock signal $S_{DLL\_CLK}$ is already locked at time T16. Suitable re-locking sequences are known in the art and therefore not described here.

After the synchronizing clock signal $S_{DLL\_CLK}$ has re-acquired synchronization, the device-external signal at the ready/busy port R/B# signal goes HIGH as shown between times T16 and T17. The non-volatile memory device 100 now becomes "ready" and the controller 90 may issue another command such as, without limitation, STATUS READ, PAGE READ and PAGE PROGRAM.

Figure 4B:
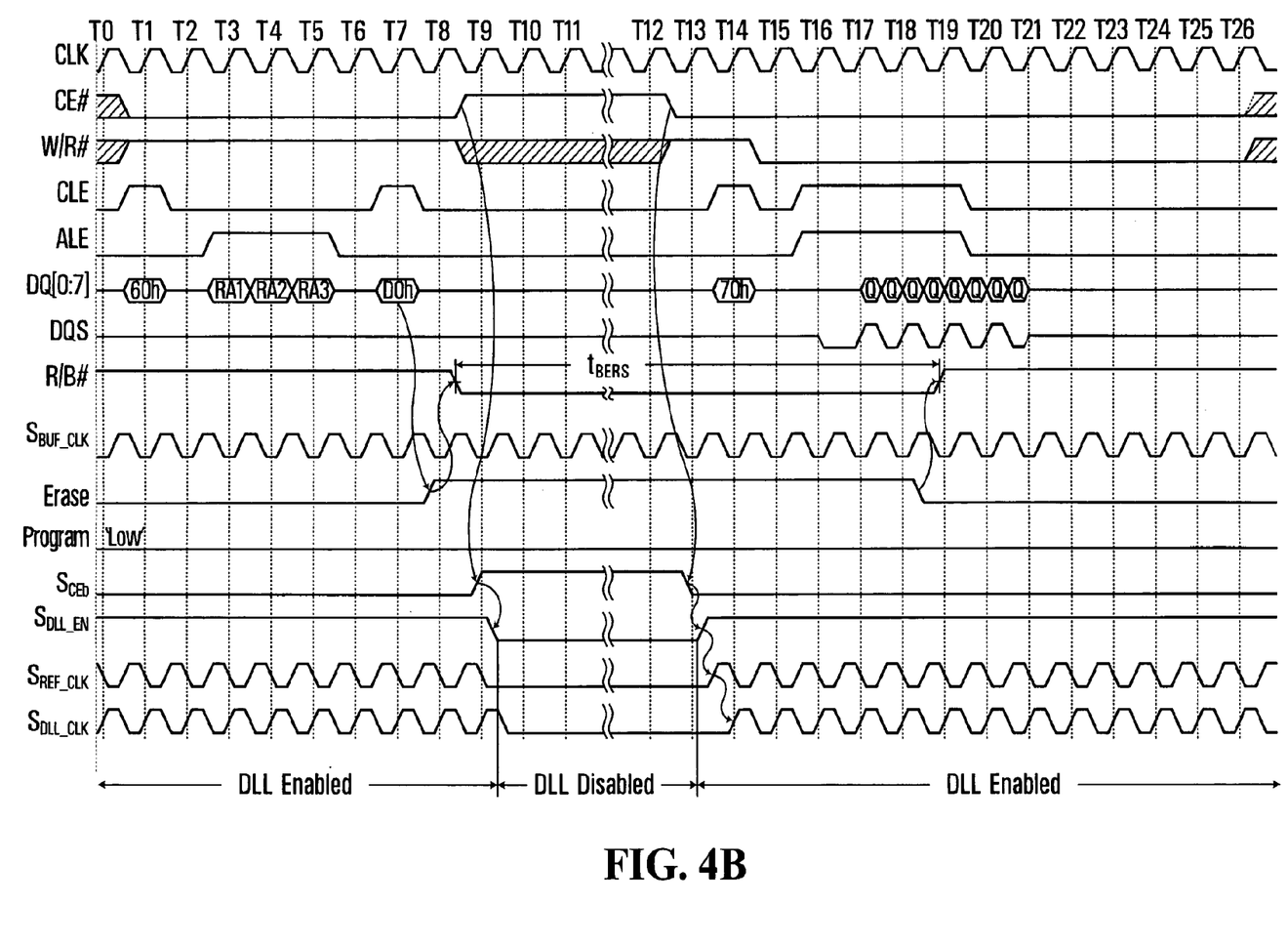
FIG. 4B is a timing diagram that shows signal transitions of various signals associated with the clock synchronization unit of FIG. 3B.

FIG. 4B is a non-limiting example timing diagram for the signals of the clock synchronization unit $200_B$ in FIG. 3B during a BLOCK ERASE operation. The timing diagram in FIG. 4B is similar to that of FIG. 4A, with the following exceptions. Specifically, between times T7 and T8, it will be noted that the $S_{DLL\_EN}$ signal at the second input of the AND logic gate $211_B$ has not dropped to the LOW state even though the ERASE signal is asserted. This is because buffered chip enable signal $S_{cEb}$ signal is still in the LOW state (meaning that the non-volatile memory device 100 remains selected), which in this embodiment overrides the clock signal decoupling effect otherwise controlled by the ERASE signal. Then, after the device-external signal at the chip enable port CE# goes to the HIGH state (between times T8 and T9), the buffered chip enable signal $S_{CEb}$ also goes to the HIGH state, and now the $S_{DLL\_EN}$ signal goes to the LOW state. This disables the AND logic gate $211_B$, causing the reference clock signal $S_{REF\_CLK}$ to stop toggling so that the DLL 220 does not expend power needlessly.

Those skilled in the art will appreciate that instead of the DLL 220, the clock synchronization unit 200 may utilize include other modules having circuit components in a feedback loop configuration. An example of such other module is a phase-locked loop (PLL). Thus, the phase-locked loop could be deactivated for a period of time while the ERASE or PROGRAM signal is asserted.

Those skilled in the art will also appreciate that the above description of the BLOCK ERASE, PAGE PROGRAM, PAGE READ and STATUS READ commands is merely illustrative, and that various modifications are possible without departing from the scope of embodiments of the invention. In addition, other current or future commands may trigger assertion of the ERASE and/or PROGRAM signals. For instance, consider the case of a hypothetical PAGE ERASE command analogous to the above described BLOCK ERASE command, but which allows a single page of a particular multi-page block to be erased without affecting the other block(s) in the page. An example of such a command is described in U.S. patent application Ser. No. 11/779,685 to Jin-Ki KIM, entitled "Partial Block Erase Architecture for Flash Memory", hereby incorporated by reference herein.

It will be understood that the non-volatile memory devices 100, $100_A$ described above can be implemented using various types of non-volatile memory integrated circuit technology, including but not limited to NAND Flash EEPROM, NOR Flash EEPROM, AND Flash EEPROM, DiNOR Flash EEPROM, Serial Flash EEPROM, Read-Only Memory (ROM), Erasable Programmable ROM (EPROM), Ferroelectric Random-Access Memory (FRAM), Magnetoresistive RAM (MRAM) and Phase-Change RAM (PCRAM).

It should also be appreciated that in some embodiments, certain signals, in particular but without limitation the clock signals and the data strobe signals, can be single-ended while in other embodiments these signals can be differential.

It should also be appreciated that in some embodiments, certain devices, in particular the input register 112 and the output driver 105, can be responsive to rising edges, falling edges or both rising edges and falling edges, thereby exhibiting single data rate (SDR), double data rate (DDR) or quadruple data rate (QDR) functionality.

Referring again to FIG. 1, the memory system 80 may, in some examples, be at least substantially compliant with the flash standard described in "Open NAND Flash Interface Specification", Revision 2.0, Feb. 27/08, the entire contents of which are herein incorporated by reference. Of course the memory system 80 may, in other examples, be at least substantially compliant with some other flash standard that is consistent with providing memory devices that include DLLs and/or PLLs.

It should also be appreciated that in some embodiments, the memory devices 100, $100_A$ can be provided with the above-described functionality at least partly through the use of a software program that is run on a computer. Such a software program could be encoded as computer-readable instructions on a computer-readable storage medium, the instructions being designed to convert the above-described functionality into low-level circuit diagrams and/or integrated circuit configurations for achieving the above describe functionality.

Certain adaptations and modifications of the described embodiments can be made. Therefore, the above discussed embodiments are considered to be illustrative and not restrictive.

The invention claimed is:

1. A non-volatile semiconductor memory device, comprising:
    an interface comprising:
        an input port for receiving an input clock signal; and
        a set of data lines for receiving commands, including a program command, the commands issued by a controller;
    a module having circuit components in a feedback loop configuration, the module being driven by a reference clock signal;
    a clock control circuit capable of controllably switching between a first operational state in which the reference clock signal tracks the input clock signal and a second operational state in which the reference clock signal is decoupled from the input clock signal; and
    a command processing unit configured to recognize the commands issued by the controller and to cause the clock control circuit to switch from the first operational state to the second operational state in response to recognizing the program command;
    wherein when the reference clock signal tracks the input clock signal, the module consumes a first amount of power and wherein when the reference clock signal is decoupled from the input clock signal, the module consumes a second amount of power that is less than the first amount of power.

2. The non-volatile semiconductor memory device defined in claim 1, further comprising control circuitry for outputting a signal indicative that the device is busy in response to the command processing unit recognizing the program command.

3. The non-volatile semiconductor memory device defined in claim 2, wherein the control circuitry is configured to output the signal indicative that the device is busy after the command processing unit causes the clock control circuit to switch from the first operational state to the second operational state.

4. The non-volatile semiconductor memory device defined in claim 1, wherein the command processing unit is configured to start a program operation in response to receipt of the program command.

5. The non-volatile semiconductor memory device defined in claim 4, wherein the command processing unit is configured to cause the clock control circuit to switch back to the first operational state after the program operation is complete.

6. The non-volatile semiconductor memory device defined in claim 5, further comprising control circuitry configured to issue a signal indicating that the device is ready after the program operation is complete.

7. The non-volatile semiconductor memory device defined in claim 6, wherein the clock control circuit comprises a delay locked loop that loses synchronization when the reference clock signal is decoupled from the input clock signal, wherein the signal indicating that the device is ready is issued after the delay locked loop has regained synchronization following the clock control circuit having switched back to the first operational state.

8. The non-volatile semiconductor memory device defined in claim 4, wherein the command processing unit is configured to cause the clock control circuit to switch back to the first operational state before the program operation is complete.

9. The non-volatile semiconductor memory device defined in claim 8, further comprising control circuitry configured to issue a signal indicating that the device is ready after the command processing unit causes the clock control circuit to switch back to the first operational state.

10. The non-volatile semiconductor memory device defined in claim 8, wherein the clock control circuit comprises a delay locked loop that loses synchronization when the reference clock signal is decoupled from the input clock signal, wherein the signal indicating that the device is ready is issued after the delay locked loop has regained synchronization following the clock control circuit having switched back to the first operational state.

11. The non-volatile semiconductor memory device defined in claim 1, further comprising a plurality of non-volatile memory cells, wherein the command processing unit is configured to cause the clock control circuit to switch back to the first operational state after at least some of the non-volatile memory cells have been programmed.

12. The non-volatile semiconductor memory device defined in claim 1, wherein the module comprises a clock synchronization circuit configured to generate a synchronizing clock signal based on the reference clock signal, wherein the clock synchronization circuit comprises at least one of a delay locked loop and a phase locked loop.

13. The non-volatile semiconductor memory device defined in claim 1, wherein the clock control circuit implements a logic AND function producing an output corresponding to the reference clock signal, wherein the logic AND function has a first input corresponding to the input clock signal and a second input corresponding to a signal that is asserted when the program command is recognized by the command processing unit.

14. The non-volatile semiconductor memory device defined in claim 1, wherein the program command is a PAGE PROGRAM command.

15. The non-volatile semiconductor memory device defined in claim 1, wherein the interface comprises an input port for receiving a device select signal from the controller, wherein the command processing unit is configured to allow the clock control circuit to switch to the second operational state even when the device select signal is indicative of the device having been selected.

16. The non-volatile semiconductor memory device defined in claim 1, wherein the interface comprises an input port for receiving a device select signal from the controller, wherein the command processing unit is configured to prevent the clock control circuit from switching to the second operational state unless the device select signal is indicative of the device having been deselected.

17. The non-volatile semiconductor memory device defined in claim 1, wherein when the reference clock signal tracks the input clock signal, the module effects a first average number of signal transitions per unit time and wherein when the reference clock signal is decoupled from the input clock signal, the module effects a second average number of signal transitions per unit time that is less than the first average number of signal transitions per unit time.

18. The non-volatile semiconductor memory device defined in claim 1, implemented as a phase-change memory device.

19. A non-volatile semiconductor memory device, comprising:
    first means for providing an input clock signal;
    a module having circuit components in a feedback loop configuration and being driven by a reference clock signal;

second means for controllably switching between a first operational state in which the reference clock signal tracks the input clock signal and a second operational state in which the reference clock signal is decoupled from the input clock signal; and third means for recognizing commands issued by a controller, including a program command, and varying the operational state of the second means in response to recognizing the program command;

wherein when the reference clock signal tracks the input clock signal, the module consumes a first amount of power and wherein when the reference clock signal is decoupled from the input clock signal, the module consumes a second amount of power that is less than the first amount of power.

20. A method implemented by a non-volatile semiconductor memory device that is provided with an input clock signal and that comprises a module with circuit components in a feedback loop configuration, the circuit components being driven by a reference clock signal, comprising:

producing the reference clock signal such that it follows the input clock signal in a first operational state of the device and such that it is decoupled from the input clock signal in a second operational state of the device, wherein when the reference clock signal follows the input clock signal, the module consumes a first amount of power and wherein when the reference clock signal is decoupled from the input clock signal, the module consumes a second amount of power that is less than the first amount of power; and causing the device to switch from the first operational state to the second operational state in response to recognizing a program command received from a controller.

21. A system, comprising:

a controller configured to issue a master clock signal and to issue commands including a program command; and a non-volatile semiconductor memory device, which comprises:

an interface comprising:
    an input port for receiving an input clock signal related to the master clock signal; and
    a set of data lines for receiving the commands issued by the controller;

a module having circuit components in a feedback loop configuration, the module being driven by a reference clock signal;

a clock control circuit capable of controllably switching between a first operational state in which the reference clock signal tracks the input clock signal and a second operational state in which the reference clock signal is decoupled from the input clock signal; and a command processing unit configured to recognize the commands issued by the controller and to cause the clock control circuit to switch from the first operational state to the second operational state in response to recognizing the program command;

wherein when the reference clock signal tracks the input clock signal, the module consumes a first amount of power and wherein when the reference clock signal is decoupled from the input clock signal, the module consumes a second amount of power that is less than the first amount of power.

* * * * *

UNITED STATES PATENT AND TRADEMARK OFFICE
CERTIFICATE OF CORRECTION

PATENT NO.        : 8,359,485 B2                                        Page 1 of 1
APPLICATION NO.   : 13/408252
DATED             : January 22, 2013
INVENTOR(S)       : HakJune Oh It is certified that error appears in the above-identified patent and that said Letters Patent is hereby corrected as shown below:

On the title page, item [56]:

The second publication that is listed under "Other Publications" on the second page of the patent, should read as follows:

TAKEUCHI, K. et al, A 56-nm CMOS 99-mm2 8-Gb Multi-Level NAND Flash Memory With 10-MB/s Program Throughput, IEEE J. of Solid-State Circuits, Vol. 42, No. 1, January 2007, pgs. 219-232.

Signed and Sealed this
Thirteenth Day of August, 2013

Teresa Stanek Rea
*Acting Director of the United States Patent and Trademark Office*